United States Patent [19]

Dachtera

[11] 4,127,899
[45] Nov. 28, 1978

[54] SELF-QUENCHING MEMORY CELL

[75] Inventor: William R. Dachtera, Poughkeepsie, N.Y.

[73] Assignee: International Business Machines Corporation, Armonk, N.Y.

[21] Appl. No.: 857,831

[22] Filed: Dec. 5, 1977

[51] Int. Cl.² ............................................. G11C 11/40
[52] U.S. Cl. .................................... 365/154; 307/291
[58] Field of Search ......................... 365/154; 307/291

[56] References Cited

U.S. PATENT DOCUMENTS

| 3,675,218 | 7/1972 | Sechler | 365/154 |
| 3,732,440 | 5/1973 | Platt et al. | 365/154 |
| 3,973,246 | 8/1976 | Millhollan et al. | 365/154 |

OTHER PUBLICATIONS

Wiedmann, Random Access Memory Cell, IBM Technical Disclosure Bulletin, vol. 14, No. 6, 11/71, pp. 1721–1722.
Berding, Simultaneous Read–Write Monolithic Storage Cell, IBM Technical Disclosure Bulletin, vol. 13, No. 3, 8/70, p. 620.

Primary Examiner—Stuart N. Hecker
Attorney, Agent, or Firm—Robert J. Haase

[57] ABSTRACT

A memory array comprising a matrix of cells each of which includes a pair of bipolar transistor inverters. The collector loads of the inverters are commonly connected to a first constant voltage buss. The emitters of the transistors are commonly connected through a second resistor to a second constant voltage buss. Separate writing and reading circuits are provided for each cell in the array so that array cells can be written into and read from simultaneously.

5 Claims, 1 Drawing Figure

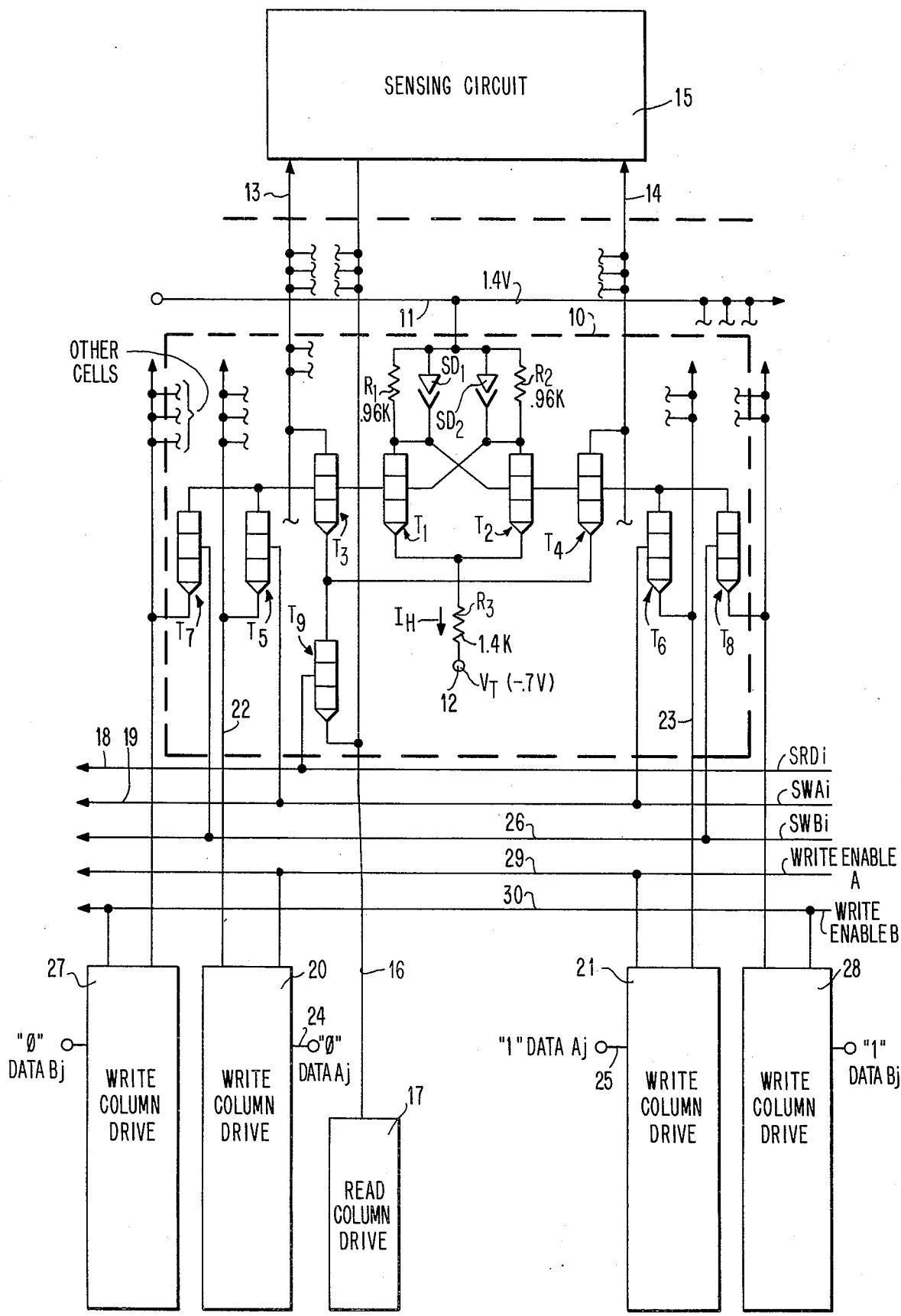

SELF-QUENCHING MEMORY CELL

BACKGROUND OF THE INVENTION

It is known that array memory cells of the flip-flop type can be written into in a reduced time, for a given applied cell writing current, if the potential available to the cell is diminished while writing is in progress. U.S. Pat. No. 3,813,653 for "Memory Cell With Reduced Voltage Supply While Writing", issued to John L. Smith et al. on May 28, 1974 and U.S. Pat. No. 3,971,004 for "Memory Cell With Decoupled Supply Voltage While Writing", issued to Andrew Dingwall on July 20, 1976 are two examples of the aforementioned technique. In each case, the cell voltage supply circuit is complicated somewhat to provide for the desired potential control action.

Some memory array applications, especially those having closely associated large scale integrated logic circuits, make it advantageous to power both the array and the logic circuits from the same constant voltage sources. Accordingly, it is desirable that enhanced memory cell writing be accomplished while permitting the application of constant voltages to each cell.

SUMMARY OF THE INVENTION

A memory array cell characterized by a holding current which is reduced automatically, when writing, so as to switch in a minimum time in response to a given input switching current. Each cell comprises a pair of cross-connected semiconductor inverter circuits which are connected between two constant voltage busses by a resistor. The circuit parameters and buss voltage values are set so that the holding current of non-addressed cells is held at a value sufficient to withstand disturbances on shared lines while the holding current is reduced automatically in the cells being addressed (read or written into). Each cell further comprises a gated sensing circuit and at least one gated writing circuit. The same cell may be simultaneously read from and be written into.

The foregoing and other features and advantages of the invention will be apparent from the following more particular description of the preferred embodiment of the invention, as illustrated in the accompanying drawing.

BRIEF DESCRIPTION OF THE DRAWING

The sole FIGURE is a simplified schematic diagram of a preferred embodiment of the invention together with additional circuits for utilizing it in an array.

DESCRIPTION OF THE PREFERRED EMBODIMENT

The memory cell 10 of the present invention comprises a pair of cross-coupled inverters together with associated reading and writing cell selection circuits. One inverter includes transistor 1, resistor $R_1$ and Schottky diode $SD_1$. The other inverter comprises transistor 2, resistor $R_2$ and Schottky diode $SD_2$. The cross-coupled inverters are directly connected to constant voltage buss 11 and, via resistor $R_3$, to constant voltage source 12. Reading is accomplished with the aid of the transistors 3, 4 and 9. The collectors of transistors 3 and 4 are connected by respective column sensing lines 13 and 14 to sensing circuit 15. The emitter of transistor 9 is connected by line 16 to read column driver 17. The emitters of transistors 3 and 4 are coupled to the collector of transistor 9. The bases of transistors 3 and 4 are respectively coupled to the bases of transistors 1 and 2. The reading circuit is enabled (selected) by a signal on word line 18 connected to the base of transistor 9.

Writing is facilitated by transistors 5 and 6 which are selected (activated) by a signal on word line 19 applied to the bases of the transistors. The transistor emitters are connected to respective write column drivers 20 and 21 via lines 22 and 23. Signals representing "0" data are applied to driver 20 via bit line 24. Similarly, signals representing "1" data are applied to driver 21 via bit line 25. Drivers 20 and 21 are activated by a signal on write enable line 29. The collectors of transistors 5 and 6 are connected to the bases of transistors 1 and 2, respectively. In accordance with one optional aspect of the present invention, whereby any two rows (words) of cells in the array may be selected simultaneously for writing purposes, a second set of writing circuits are provided. The second set comprises transistors 7 and 8, word line 26, column drivers 27 and 28 and write enable line 30 correspond in structure and function to transistors 5 and 6, word line 19, column drivers 20 and 21 and write enable line 29.

The dual writing configuration allows two separate data sources to address any of the cells in the array. Thus, it is possible to write into two array words simultaneously or to read from one word while writing into another word. It is also possible, in accordance with the present invention, to read from a word at the same time that the same word is being written into.

In operation, reading is accomplished by raising the base of transistor 9 above the other bases which have their emitters (not shown) similarly connected to line 16 at the output of read column driver 17. A differential current is provided through transistors 3 and 4 to sensing circuit 15. The reading current flows through the collector load resistor and Schottky diode on the high side of the flip-flop cell. for example, assuming that the collector of transistor 2 is more positive than the collector of transistor 1 when the cell is being read, the reading current flows through resistor $R_2$ and Schottky diode $SD_2$ lowering the potential at the collector of transistor 2. The resistance of resistor $R_3$ is set, relative to the effective impedance of the cross-connected inverters comprising the flip-flop, so that the emitters of transistors 1 and 2 are not effectively coupled to a constant current source. As a consequence, the cell holding current flowing through resistor $R_3$ is reduced during the cell reading time. The reduced holding current, however, remains sufficient to maintain data stability in the cell.

A similar reduction in the cell holding current automatically occurs while the cell is being written into. This action (termed "self quenching") speeds up the writing of new data for a given amount of writing current. To illustrate the writing mode, it is assumed that the $T_2$ collector is high with respect to the $T_1$ collector and that it is desired to write data into the cell from the data source associated with write enable line 29. Accordingly, line 29 is conditioned to turn on drivers 20 and 21 while line 30 is conditioned to turn off drivers 27 and 28. Word line 19 is addressed and carries a signal which conditions transistors 5 and 6 for conduction. A signal representing a "0" is applied to driver 20 to produce on write column line 22 a signal which completes the conduction requirements of transistor 5, turning it on. Writing current flows through transistor 5 and the base connections of transistors 3 and 1 into resistor $R_2$ and Schottky diode $SD_2$ to reduce the potential at the collector of transistor 2. Writing time is reduced, for a given amount of writing current, because the cell holding current flowing through resistor $R_3$ is reduced as a result of the reduction of collector potential and the fact that the emitters of $T_1$ and $T_2$ are not connected to a constant current source. A constant current source is avoided by selecting a proper value for the resistor $R_3$ relative to the effective impedance of the cross-connected inverters comprising $T_1$, $R_1$, $SD_1$ and $T_2$, $R_2$, $SD_2$. By virtue of the "self-quenching" action, the ratio of the writing current flowing on line 22 to the holding current flowing through $R_3$ in the steady state can be about 1 rather than 2 or more as is usually the case when the holding current is provided by a constant current source.

It should be noted that the data in the storage cell becomes immediately available for detection. In fact, the cell can be read simultaneously with the writing of data. The slight reduction of the cell holding current due to the activation of the reading circuits further aids the switching of the cell during the writing of new data as compared to the case where the cell is not being simultaneously read.

While the invention has been particularly shown and described with reference to the preferred embodiment thereof, it will be understood by those skilled in the art that various changes in form and details may be made therein without departing from the spirit and scope of the invention.

What is claimed is:

1. A self-quenching memory cell comprising:
   a pair of cross-connected transistor inverters, the base of each transistor being connected to the junction of the collector and the collector load of the other transistor,
   a resistor,
   first and second constant value voltage sources,
   said collectors of said transistors being connected by respective ones of said loads to said first voltage source,
   the emitters of said transistors being connected by said resistor to said second voltage source,
   the resistance of said resistor being set relative to the effective impedance of said cross-connected transistor inverters so that said resistor and said second voltage source do not provide a constant current to said emitters when data is written into said cell,
   first actuable means connected to said bases of said transistors for writing data into said cell, and
   second actuable means connected to said bases of said transistors for reading data from said cell.

2. The memory cell defined in claim 1 wherein each said collector load comprises a resistor connected in parallel with a Schottky diode.

3. The memory cell defined in claim 1 wherein said second actuable means comprises third, fourth and fifth transistors,
   the bases of said third and fourth transistors being connected to the bases of said first and second transistors, respectively,
   the emitters of said third and fourth transistors being connected to the collector of said fifth transistor, said cell further including
   a pair of read column sense lines
   a read column driver line and
   a read word selection line,
   the collectors of said third and fourth transistors being connected respectively to said sense lines,
   the emitter of said fifth transistor being connected to said driver line, and
   the base of said fifth transistor being connected to said read word selection line.

4. The memory cell defined in claim 1 wherein said first actuable means comprises sixth and seventh transistors, the collectors of said sixth and seventh transistors being connected to the bases of said first and second transistors, respectively, said cell further including,
   a pair of write column driver lines, and
   a write word selection line,
   the emitters of said sixth and seventh transistors being connected respectively to said driver lines, and
   the bases of said sixth and seventh transistors being connected to said write word selection line.

5. The memory cell defined in claim 1 wherein each said collector load comprises a resistor connected in parallel with a Schottky diode, and
   wherein said first actuable means comprises separately actuable means for writing data into said cell from more than one data source.

* * * * *

Disclaimer 4,127,899.—*William R. Dachtera*, Poughkeepsie, N.Y. SELF-QUENCHING MEMORY CELL. Patent dated Nov. 28, 1978. Disclaimer filed Apr. 4, 1983, by the assignee, *International Business Machines Corp.*

Hereby enters this disclaimer to claims 1, 2 and 3 of said patent.

[*Official Gazette June 7, 1983.*]